United States Patent
Ohnuki

(10) Patent No.: US 8,519,272 B2
(45) Date of Patent: Aug. 27, 2013

(54) SUSPENSION SUBSTRATE, MANUFACTURING METHOD OF SUSPENSION SUBSTRATE, SUSPENSION, DEVICE-MOUNTED SUSPENSION, AND HARD DISK DRIVE

(75) Inventor: Masao Ohnuki, Tokyo-to (JP)

(73) Assignee: Dai Nippon Printing Co., Ltd., Tokyo-to (JP)

(*) Notice: Subject to any disclaimer, the term of this patent is extended or adjusted under 35 U.S.C. 154(b) by 164 days.

(21) Appl. No.: 13/053,349

(22) Filed: Mar. 22, 2011

(65) Prior Publication Data

US 2011/0235213 A1    Sep. 29, 2011

(30) Foreign Application Priority Data

Mar. 24, 2010 (JP) ................ 2010-067469

(51) Int. Cl.
*H05K 1/00* (2006.01)

(52) U.S. Cl.
USPC .......................................................... 174/254

(58) Field of Classification Search
USPC ........... 174/254–257, 250–251, 261; 439/66; 360/104, 244.1, 244.5, 245.9, 264.2
See application file for complete search history.

(56) References Cited

U.S. PATENT DOCUMENTS

| 5,959,807 | A | 9/1999 | Jurgenson |
| 6,459,549 | B1 | 10/2002 | Tsuchiya et al. |
| 2002/0131210 | A1 | 9/2002 | Habata |
| 2005/0122627 | A1 | 6/2005 | Kanagawa et al. |
| 2008/0170333 | A1 | 7/2008 | Ohsawa et al. |

FOREIGN PATENT DOCUMENTS

| JP | 10-069745 A | 3/1998 |
| JP | 2001-043647 A | 2/2001 |
| JP | 2001-052456 A | 2/2001 |
| JP | 2001-305750 A | 11/2001 |
| JP | 2002-269714 A | 9/2002 |
| JP | 2005-167066 A | 6/2005 |
| JP | 2006-120288 A | 5/2006 |
| JP | 2007-095136 A | 4/2007 |
| JP | 2008-172012 A | 7/2008 |
| JP | 2009-118626 A | 5/2009 |

*Primary Examiner* — Jeremy Norris
*Assistant Examiner* — Tremesha S Willis
(74) *Attorney, Agent, or Firm* — Ladas & Parry LLP

(57) ABSTRACT

The object of the present invention is to provide a suspension substrate such that the thickness of an insulating layer for supporting a connecting terminal having a flying structure is uniform. The present invention attains the object by providing a suspension substrate, comprising a metal supporting substrate, an insulating layer formed on the metal supporting substrate, and a wiring layer formed on the insulating layer, wherein a wiring layer projecting section is provided by a plurality; an adjusting section formed on the insulating layer and composed of a first adjusting section and a second adjusting section is provided on both sides of the plural wiring layer projecting sections; and a gap between a first outermost wiring layer projecting section and the first adjusting section, a gap between the adjacent wiring layer projecting sections, and a gap between a second outermost wiring layer projecting section and the second adjusting section are equal.

6 Claims, 9 Drawing Sheets

—PRIOR ART—

—PRIOR ART—

SUSPENSION SUBSTRATE, MANUFACTURING METHOD OF SUSPENSION SUBSTRATE, SUSPENSION, DEVICE-MOUNTED SUSPENSION, AND HARD DISK DRIVE

TECHNICAL FIELD

The present invention relates to a suspension substrate such that the thickness of an insulating layer for supporting a connecting terminal having a flying structure is uniform.

BACKGROUND ART

A suspension substrate mounted with a device such as a magnetic head mounted on a read/write electrical circuit with a suspension is known as a circuit board used for an HDD (a hard disk drive). The suspension substrate ordinarily has a fundamental structure such that a metal supporting substrate (such as SUS), an insulating layer (such as a polyimide resin) and a wiring layer (such as Cu) are laminated in this order, and is ordinarily provided at one tip with a device mounting area to be mounted with the device and provided at the other tip with an external circuit board connecting area to connect with an external circuit board.

A connecting terminal area including a connecting terminal is ordinarily formed in the suspension substrate for electrically connecting the device and the external circuit board. This connecting terminal ordinarily has a flying structure projecting from the metal supporting substrate. The reasons therefor are various, and one of the reasons is conceived to be that unless the connecting terminal has the flying structure, there is a possibility that the insulating layer located under the connecting terminal melts due to heat during solder joining to short-circuit the connecting terminal and the metal supporting substrate. On the other hand, the problem is that the connecting terminal with the flying structure is so weak in mechanical strength as to be easily transformed by reason of not being supported by the metal supporting substrate.

Here, a suspension substrate with a circuit, in which a pattern terminating portion as a connecting terminal for connecting with a terminal of a magnetic head is formed in a circuit pattern and an end face of the pattern terminating portion is aligned with an end face of an insulating layer directly therebelow or projects from an end face of the insulating layer in a tip direction, is disclosed in Japanese Patent Application Publication No. 2006-120288. In addition, the patterning of the insulating layer by etching is described in Japanese Patent Application Publication No. 2006-120288.

Also, it is described in Japanese Patent Application Publication No. 2001-305750 that in an etching method of a polyimide film, a photosensitive resin layer is first disposed on both faces of the polyimide film and subject to exposure and development to thereby form a resist pattern, and next the obtained resist pattern is further subject to ultraviolet-light irradiation to improve the hardness of the resist pattern. In addition, the patterning of an insulating layer by wet etching is described in Japanese Patent Application Publication No. 2001-305750.

SUMMARY OF INVENTION

Technical Problem

A connecting terminal area is ordinarily provided with plural connecting terminals each having a flying structure. It is described in Japanese Patent Application Publication No. 2006-120288 that the connecting terminals are supported by the insulating layer. However, the problem is that the etching of the insulating layer by conventional wet etching causes the thickness of the insulating layer for supporting each of the connecting terminals to vary with reagent circumference amount. In particular, the problem is that a thin insulating layer for supporting the connecting terminals does not allow a sufficient reinforcing effect to easily transform the connecting terminals.

The present invention has been made in view of the above-mentioned problems, and the main object thereof is to provide a suspension substrate such that the thickness of an insulating layer for supporting a connecting terminal having a flying structure is uniform.

Solution to Problem

To solve the above-mentioned problems, the present invention provides a suspension substrate, comprising a metal supporting substrate, an insulating layer formed on the metal supporting substrate, and a wiring layer formed on the insulating layer; wherein in a connecting terminal area for connecting with a device, the wiring layer has a wiring layer projecting section projecting from an end portion of the metal supporting substrate and composing a connecting terminal; in the connecting terminal area, the insulating layer has an insulating layer projecting section projecting from the end portion of the metal supporting substrate and supporting the wiring layer projecting section; the wiring layer projecting section is provided by a plurality; an adjusting section formed on the insulating layer and composed of a first adjusting section and a second adjusting section is provided on both sides of the plural wiring layer projecting sections; and in a case when outermost wiring layer projecting sections of the plural wiring layer projecting sections are regarded as a first outermost wiring layer projecting section and a second outermost wiring layer projecting section respectively, a gap between the first outermost wiring layer projecting section and the first adjusting section, a gap between the adjacent wiring layer projecting sections, and a gap between the second outermost wiring layer projecting section and the second adjusting section are equal.

According to the present invention, a gap between a first outermost wiring layer projecting section and a first adjusting section, a gap between adjacent wiring layer projecting sections, and a gap between a second outermost wiring layer projecting section and a second adjusting section are equal, so that the reagent circumference amount of an etching reagent in forming an insulating layer may be uniformized to allow a suspension substrate such that the thickness of an insulating layer projecting section for supporting a wiring layer projecting section is uniform.

In the present invention, the adjusting section is preferably a part of a cover layer for covering the wiring layer. The reason therefor is that an adjusting section may be formed simultaneously with the formation of a cover layer and the simplification of a manufacturing process may be attained.

In the present invention, the adjusting section is preferably a part of the wiring layer in a routing area. The reason therefor is that the use of a part of a wiring layer in a routing area as an adjusting section allows saving of space.

In the present invention, the adjusting section is preferably a dummy wiring section not connected electrically with the wiring layer. The reason therefor is that design freedom of a wiring layer is raised.

In the present invention, a thickness of the insulating layer projecting section for supporting the first outermost wiring layer projecting section and a thickness of the insulating layer projecting section for supporting the second outermost wiring layer projecting section are preferably 50% or more of the insulating layer projecting section for supporting an internal wiring layer projecting section inside the plural wiring layer projecting sections. The reason therefor is that uniformity is further improved to allow a suspension substrate which is transformed with difficulty.

In the present invention, the gap between the first outermost wiring layer projecting section and the first adjusting section, the gap between the adjacent wiring layer projecting sections, and the gap between the second outermost wiring layer projecting section and the second adjusting section are preferably each within 30 to 70 μm.

Furthermore, the present invention provides a manufacturing method of a suspension substrate, comprising the steps of: preparing a laminated body and etching an insulating member, wherein in the laminated body preparing step, the laminated body comprises a metal supporting substrate, an insulating member formed on the metal supporting substrate, and a wiring layer formed on the insulating member; in a position for forming a connecting terminal area for connecting with a device, the wiring layer has a wiring layer projecting section projecting from an end portion of the metal supporting substrate and composing a connecting terminal; the wiring layer projecting section is provided by a plurality; an adjusting section formed on the insulating member and composed of a first adjusting section and a second adjusting section is provided on both sides of the plural wiring layer projecting sections; and in a case when outermost wiring layer projecting sections of the plural wiring layer projecting sections are regarded as a first outermost wiring layer projecting section and a second outermost wiring layer projecting section respectively, a gap between the first outermost wiring layer projecting section and the first adjusting section, a gap between the adjacent wiring layer projecting sections, and a gap between the second outermost wiring layer projecting section and the second adjusting section are equal; and wherein in the insulating member etching step, the insulating member is wet-etched while using the wiring layer projecting section and the adjusting section as a resist to form an insulating layer having an insulating layer projecting section projecting from the end portion of the metal supporting substrate and supporting the wiring layer projecting section.

According to the present invention, by using a laminated body, in which a gap between a first outermost wiring layer projecting section and a first adjusting section, a gap between adjacent wiring layer projecting sections, and a gap between a second outermost wiring layer projecting section and a second adjusting section are equal, the reagent circumference amount of an etching reagent in forming an insulating layer may be uniformized to allow a suspension substrate such that the thickness of an insulating layer projecting section for supporting a wiring layer projecting section is uniform.

In the present invention, the adjusting section is preferably a part of a cover layer for covering the wiring layer. The reason therefor is that an adjusting section may be formed simultaneously with the formation of a cover layer and the simplification of a manufacturing process may be attained.

In the present invention, the adjusting section is preferably a part of the wiring layer in a routing area. The reason therefor is that the use of a part of a wiring layer in a routing area as an adjusting section allows saving of space In the present invention, the adjusting section is preferably a dummy wiring section not connected electrically with the wiring layer. The reason therefor is that design freedom of a wiring layer is raised.

Furthermore, the present invention provides a suspension, including the above-mentioned suspension substrate.

According to the present invention, the use of the above-mentioned suspension substrate allows a suspension excellent in connection stability.

Furthermore, the present invention provides a device-mounted suspension, comprising the above-mentioned suspension and a device mounted on a device mounting area of the suspension.

According to the present invention, the use of the above-mentioned suspension allows a device-mounted suspension excellent in connection stability.

Furthermore, the present invention provides a hard disk drive, comprising the above-mentioned device-mounted suspension.

According to the present invention, the use of the above-mentioned device-mounted suspension allows a further highly functionalized hard disk drive.

Advantageous Effects of Invention

In the present invention, the effect such as to allow a suspension substrate such that the thickness of an insulating layer for supporting a connecting terminal having a flying structure is uniform is produced.

DESCRIPTION OF EMBODIMENTS

A suspension substrate, a manufacturing method of a suspension substrate, a suspension, a device-mounted suspension and a hard disk drive of the present invention are hereinafter described in detail.

A. Suspension Substrate

A suspension substrate of the present invention is first described. The suspension substrate of the present invention comprises a metal supporting substrate, an insulating layer formed on the above-mentioned metal supporting substrate, and a wiring layer formed on the above-mentioned insulating layer, wherein in a connecting terminal area for connecting with a device, the above-mentioned wiring layer has a wiring layer projecting section projecting from the end portion of the above-mentioned metal supporting substrate and composing a connecting terminal; in the above-mentioned connecting terminal area, the above-mentioned insulating layer has an insulating layer projecting section projecting from an end portion of the above-mentioned metal supporting substrate and supporting the above-mentioned wiring layer projecting section; the above-mentioned wiring layer projecting section is provided by a plurality; an adjusting section formed on the above-mentioned insulating layer and composed of a first adjusting section and a second adjusting section is provided on both sides of the above-mentioned plural wiring layer projecting sections; and in a case when the outermost wiring layer projecting sections of the above-mentioned plural wiring layer projecting sections are regarded as a first outermost wiring layer projecting section and a second outermost wiring layer projecting section respectively, a gap between the above-mentioned first outermost wiring layer projecting section and the above-mentioned first adjusting section, a gap between the above-mentioned adjacent wiring layer projecting sections, and a gap between the above-mentioned second outermost wiring layer projecting section and the above-mentioned second adjusting section are equal.

Figure 1:
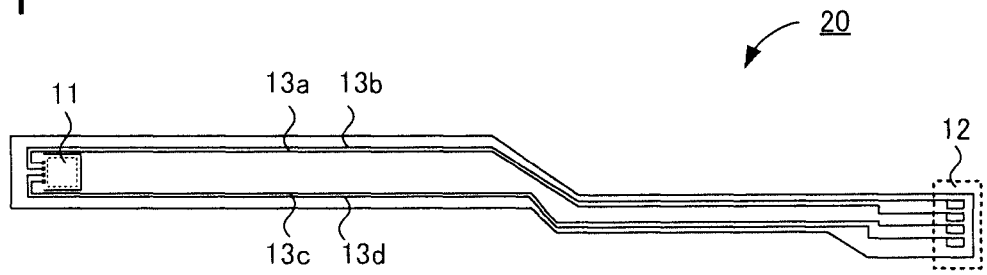
FIG. 1 is a schematic plan view showing an example of a suspension substrate of the present invention.

FIG. 1 is a schematic plan view showing an example of the suspension substrate of the present invention. For convenience, the description of the insulating layer and a cover layer is omitted from the drawing. A suspension substrate 20 shown in FIG. 1 has: a device mounting area 11 to be mounted with a device and formed on the head portion side, an external circuit board connecting area 12 to connect with an external circuit board and formed on the tail portion side, and a wiring layer 13 (13a to 13d) for electrically connecting the device mounting area 11 and the external circuit board connecting area 12. Each of the wiring layers 13a and 13b, and the wiring layers 13c and 13d form a wiring pair; the one is for recording and the other is for replay.

Figure 2A:
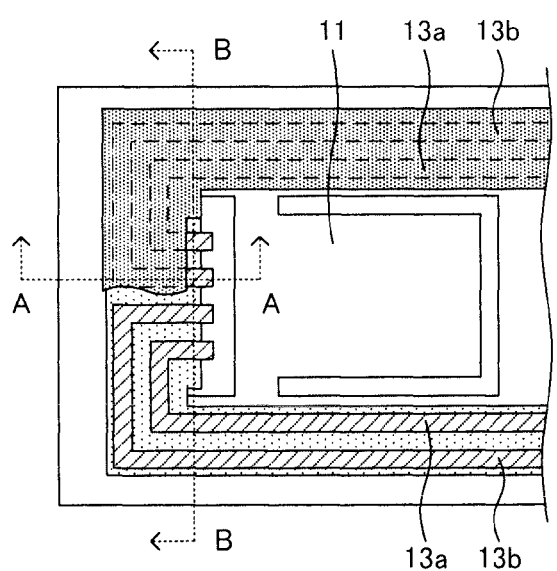
FIGS. 2A to 2C are each a schematic view explaining a suspension substrate of the present invention.
Figure 2B:
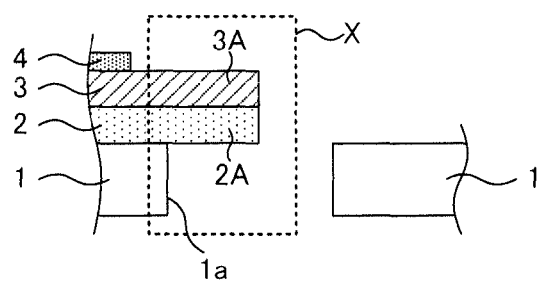

FIG. 2A is an enlarged view enlarging the periphery of the head portion of FIG. 1. For convenience, a part of the cover layer is omitted from the drawing. As shown in FIG. 2A, the wiring layers 13a to 13d are formed so as to be capable of connecting with the device mounted on the device mounting area 11. FIG. 2B is an A-A cross-sectional view of FIG. 2A. The suspension substrate shown in FIG. 2B comprises a metal supporting substrate 1, an insulating layer 2 formed on the metal supporting substrate 1, a wiring layer 3 formed on the insulating layer 2, and a cover layer 4 formed on the wiring layer 3. In addition, in a connecting terminal area X, the wiring layer 3 has a wiring layer projecting section 3A projecting from an end portion 1a of the metal supporting substrate 1 and composing a connecting terminal. Also, in the connecting terminal area X, the insulating layer 2 has an insulating layer projecting section 2A projecting from the end portion 1a of the metal supporting substrate 1 and supporting the wiring layer projecting section 3A.

Figure 2C:
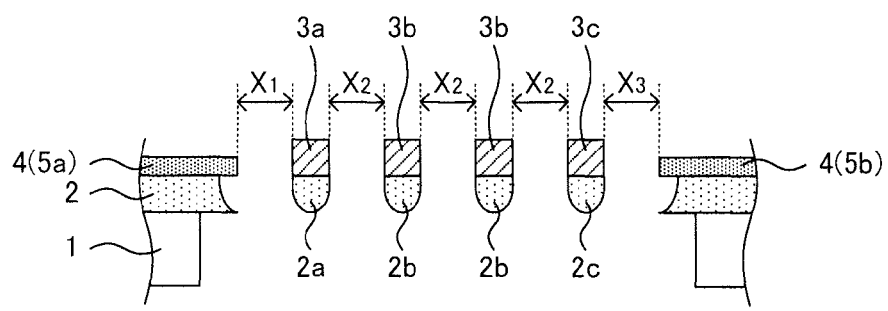

FIG. 2C is a B-B cross-sectional view of FIG. 2A. FIG. 2C is an aspect such that a part of the cover layer 4 is a first adjusting section 5a and a second adjusting section 5b. In FIG. 2C, four lines of the wiring layer projecting sections (the wiring layer projecting sections 3a to 3c) are provided. Here, the wiring layer projecting section 3a is a first outermost wiring layer projecting section, the wiring layer projecting section 3c is a second outermost wiring layer projecting section, and the wiring layer projecting sections 3b are internal wiring layer projecting sections. Also, in the present invention, the first adjusting section 5a and the second adjusting section 5b formed on the insulating layer 2 are provided on both sides of the four lines of the wiring layer projecting sections. In addition, the present invention is greatly characterized in that a gap $X_1$ between the first outermost wiring layer projecting section 3a and the first adjusting section 5a, a gap $X_2$ between the adjacent wiring layer projecting sections 3b, and a gap $X_3$ between the second outermost wiring layer projecting section 3c and the second adjusting section 5b are equal.

Here, "the gap $X_1$, the gap $X_2$ and the gap $X_3$ are equal" signifies that the gap $X_1$ and the gap $X_3$ are each within 0.8 to 1.2 times the length of the gap $X_2$; and preferably, within 0.9 to 1.1 times. This value is a value obtained by rounding off to one decimal place. In FIG. 2C, the gap $X_2$ exists by three and each of the gaps $X_2$ does not strictly need to be equal. In the present invention, all of the gaps $X_2$ may be included within ±10% or less of an average value of the plural gaps $X_2$, and all of the gaps $X_2$ are preferably included within ±5%. The average value of the gaps $X_2$ is used when the gap $X_1$ and the gap $X_3$ are compared with the gaps $X_2$. The values of $X_1$, $X_2$ and $X_3$ are not particularly limited and each of them is preferably within 20 to 80 μm, more preferably within 30 to 70 μm, and far more preferably within 40 to 50 μm.

Figure 3:
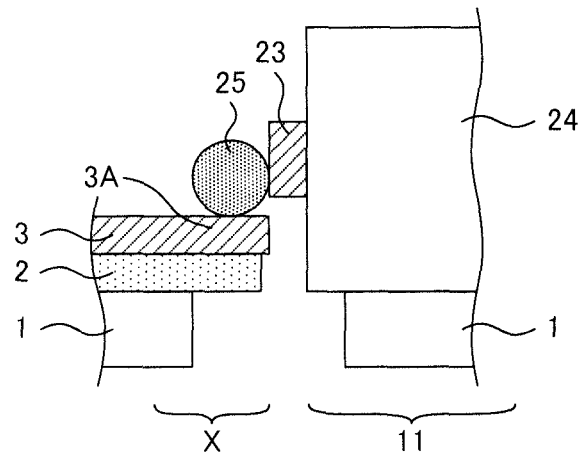
FIG. 3 is a schematic cross-sectional view explaining a suspension substrate of the present invention.

As shown in FIG. 3, the wiring layer projecting section 3A in the connecting terminal area X and a connecting terminal 23 of a device 24 mounted on the device mounting area 11 are electrically connected by a solder ball 25.

According to the present invention, a gap between a first outermost wiring layer projecting section and a first adjusting section, a gap between adjacent wiring layer projecting sections, and a gap between a second outermost wiring layer projecting section and a second adjusting section are equal, so that the reagent circumference amount of an etching reagent in forming an insulating layer may be uniformized to provide a suspension substrate such that the thickness of an insulating layer projecting section for supporting a wiring layer projecting section is uniform. The reagent circumference amount of an etching reagent is described in the after-mentioned FIGS. 10 and 11 in detail.

The suspension substrate of the present invention is hereinafter described while dividing into a member of the suspension substrate and a constitution of the suspension substrate.

1. Member of Suspension Substrate

The member of the suspension substrate of the present invention is first described. The suspension substrate of the present invention comprises at least a metal supporting substrate, an insulating layer, a wiring layer and an adjusting section.

The metal supporting substrate in the present invention is ordinarily used as a supporting substrate of the suspension substrate. A material for the metal supporting substrate is not particularly limited and is preferably metal having a spring property. Examples of the material for the metal supporting substrate include SUS. The thickness of the metal supporting substrate varies with kinds of the material therefor and is within 10 to 20 μm, for example.

The insulating layer in the present invention is a layer formed on the metal supporting substrate. Examples of a material for the insulating layer include a polyimide resin (PI). The material for the insulating layer may be a photosensitive material or a non-photosensitive material. The thickness of the insulating layer is within 5 to 10 μm, for example.

The wiring layer in the present invention is formed on the insulating layer. Examples of a material for the wiring layer include metals, and preferably copper (Cu) above all. The thickness of the wiring layer is preferably within 5 to 18 μm, for example, and within 9 to 12 μm, above all. The wiring layer in the present invention may be covered with a plating portion. Examples of the plating portion include a gold plating portion. A nickel plating portion may be formed as a ground of the gold plating portion. The thickness of the plating portion is within 0.1 to 4.0 μm, for example.

The suspension substrate of the present invention preferably has a cover layer for covering the wiring layer. Examples of a material for the cover layer include a polyimide resin (PI). The material for the cover layer may be a photosensitive material or a non-photosensitive material. The thickness of the cover layer is not particularly limited and is preferably within 2 to 30 μm, and more preferably within 2 to 10 μm, for example.

The adjusting section in the present invention functions as a resist in forming the insulating layer by wet etching. In addition, in the present invention, the reagent circumference amount of an etching reagent is adjusted by disposing the adjusting section in a predetermined position. A material for the adjusting section in the present invention is ordinarily a material having a lower etching rate than the material for the insulating layer. More specifically, the material for the adjusting section preferably has an etching rate such as to be capable of substantially disregarding etching of the adjusting section until patterning of the insulating layer is completed. Such a material for the adjusting section is not particularly limited and examples thereof include a metal such as copper and a resin such as a polyimide resin. The material for the adjusting section is preferably a material high in adhesion properties to the insulating layer. The reason therefor is that an etching reagent for the insulating layer may be prevented from permeating between the adjusting section and the insulating layer to allow processing with high accuracy. In particular, in the case where the material for the insulating layer is a polyimide resin, the use of copper or a polyimide resin as the material for the adjusting section allows adhesion properties to the insulating layer to be raised as compared with the case of using a photoresist using a conventional photosensitive resin. Also, in the present invention, the material for the adjusting section is preferably the same as the material for the cover layer or the wiring layer. A specific constitution of the adjusting section is described in "2. Constitution of suspension substrate" in detail.

2. Constitution of Suspension Substrate

Next, the constitution of the suspension substrate of the present invention is described. The suspension substrate of the present invention has a connecting terminal area for connecting with a device. Examples of the device mounted on the suspension substrate include a magnetic head mounted on a read/write electrical circuit with a suspension, an actuator, and a semiconductor. The above-mentioned actuator may or may not have a magnetic head.

Figure 4A:
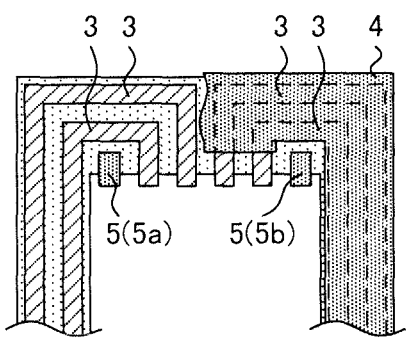
FIGS. 4A to 4C are each a schematic plan view explaining a suspension substrate of the present invention.

In the present invention, as shown in the above-mentioned FIGS. 2A to 2C, the adjusting section composed of the first adjusting section 5a and the second adjusting section 5b is preferably a part of the cover layer 4 for covering the wiring layer 3. The reason therefor is that the adjusting section may be formed simultaneously with the formation of the cover layer and the simplification of a manufacturing process may be attained. Also, in the present invention, as shown in FIG. 4A, the adjusting section 5 may be composed of the same material as the cover layer 4 and provided discontinuously with the cover layer 4. In this case, the position of the adjusting section does not need to be considered, so that design freedom of the cover layer 4 may be raised. In FIG. 4A, for convenience, a part of the cover layer 4 is omitted. Also, in the present invention, a material having a lower etching rate than the material for the cover layer 4 may be used for the material for the adjusting section 5 provided discontinuously with the cover layer 4. For example, the use of a polyimide resin having a high etching rate and a polyimide resin having a low etching rate for the cover layer 4 and the adjusting section 5 respectively brings the advantage that the range of material selection of the cover layer 4 extends.

Figure 4B:
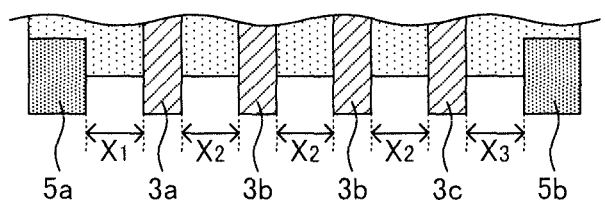
Figure 4C:
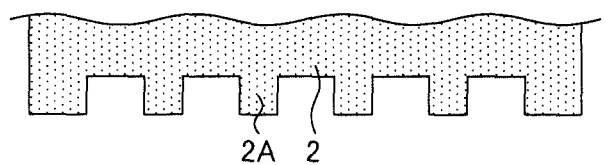

FIG. 4B is an enlarged view enlarging the connecting terminal area in FIG. 4A, and FIG. 4C is a view observing FIG. 4B from the back side. As shown in FIG. 4B, in the present invention, a gap $X_1$ between the first outermost wiring layer projecting section 3a and the first adjusting section 5a, a gap $X_2$ between the adjacent wiring layer projecting sections 3b, and a gap $X_3$ between the second outermost wiring layer projecting section 3c and the second adjusting section 5b are equal. Also, as shown in FIG. 4C, the insulating layer 2 has an insulating layer projecting section 2A for supporting a wiring layer projecting section.

Figure 5A:
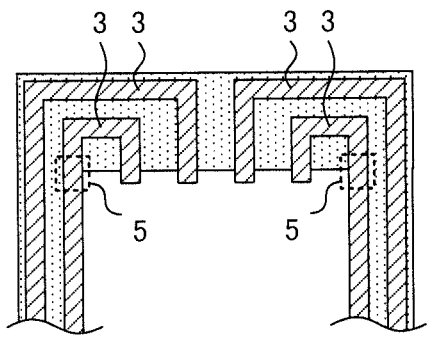
FIGS. 5A and 5B are each a schematic plan view explaining a suspension substrate of the present invention.
Figure 5B:
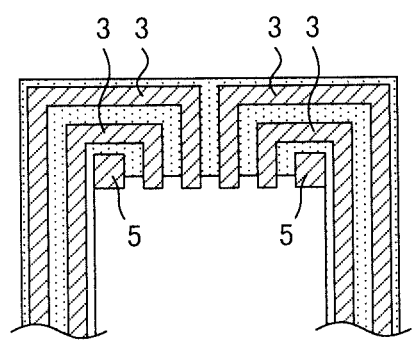

Also, in the present invention, as shown in FIG. 5A, the adjusting section 5 is preferably a part of the wiring layer 3 in a routing area. The reason therefor is that the use of a part of the wiring layer in a routing area as the adjusting section allows saving of space. Here, the routing area signifies an area of the wiring layer from the connecting terminal area (device connecting area) to the external circuit board connecting area in the present invention. Also, in the present invention, as shown in FIG. 5B, the adjusting section 5 may be a dummy wiring section not connected electrically with the wiring layer 3. In this case, the position of the adjusting section does not need to be considered, so that design freedom of the wiring layer 3 may be raised. The dummy wiring section is preferably formed simultaneously with the wiring layer.

Figure 6:
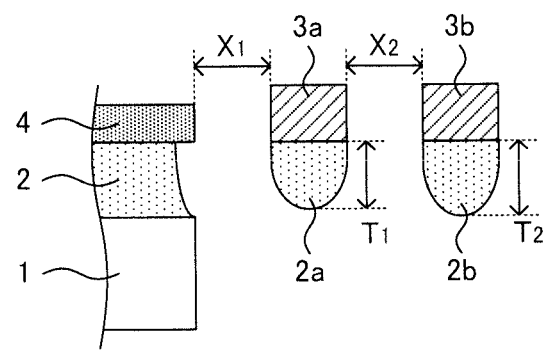
FIG. 6 is a schematic cross-sectional view explaining a suspension substrate of the present invention.

Also, in the present invention, as shown in FIG. 6, in the case where the gap $X_1$ is somewhat larger than the gap $X_2$, the thickness $T_1$ of an insulating layer projecting section 2a for supporting the first outermost wiring layer projecting section 3a tends to become smaller than the thickness $T_2$ of an insulating layer projecting section 2b for supporting the internal wiring layer projecting sections 3b. The thickness $T_1$ is preferably 50% or more of the thickness $T_2$, more preferably 70% or more, and far more preferably 90% or more. On the contrary, in the case where the gap $X_1$ is somewhat smaller than the gap $X_2$, the thickness $T_1$ tends to become larger than the thickness $T_2$. The thickness $T_1$ is preferably 150% or less of the thickness $T_2$, and more preferably 100% or less. FIG. 6 shows a relation between the thickness $T_1$ of an insulating layer projecting section 2a for supporting the first outermost wiring layer projecting section 3a and the thickness $T_2$ of an insulating layer projecting section 2b for supporting the internal wiring layer projecting sections 3b, and also a relation between the thickness of an insulating layer projecting section for supporting the second outermost wiring layer projecting section and the thickness of an insulating layer projecting section for supporting the internal wiring layer projecting sections is the same as the above.

Also, in the present invention, the smallest thickness among the thickness of an insulating layer projecting section for supporting the first outermost wiring layer projecting section, the thickness of an insulating layer projecting section for supporting the second outermost wiring layer projecting section, and the thickness of an insulating layer projecting section for supporting the internal wiring layer projecting sections is preferably 4 μm or more, and more preferably 8 μm or more. The reason therefor is that too small thickness of an insulating layer projecting section brings a possibility of not sufficiently being capable of protecting the wiring layer projecting section so that transformation thereof may be easily caused.

Figure 7A:
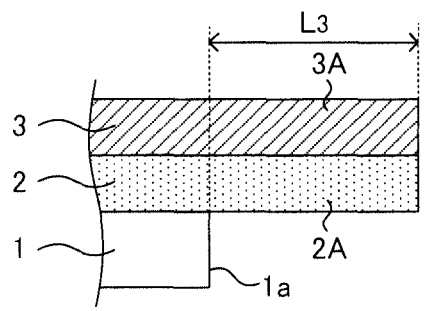
FIGS. 7A to 7C are each a schematic view explaining a suspension substrate of the present invention.
Figure 7B:
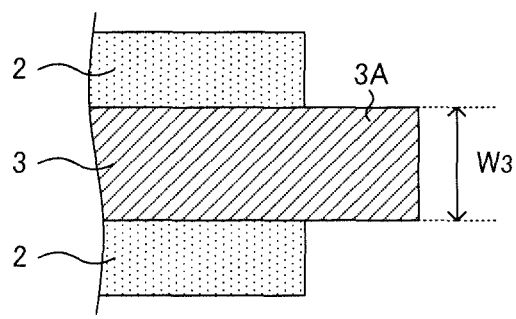
Figure 7C:
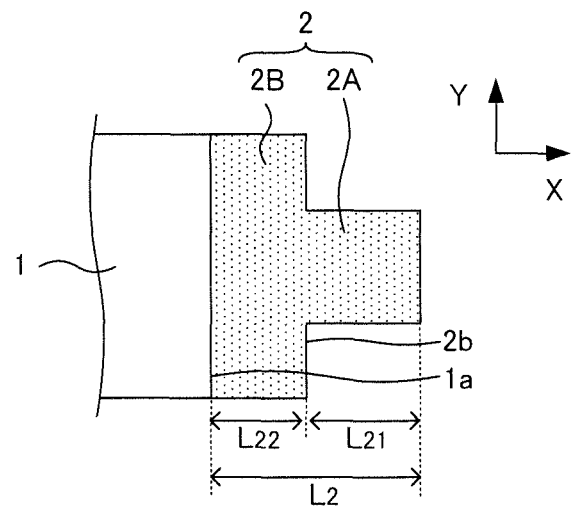

In the connecting terminal area, the wiring layer and the insulating layer have the wiring layer projecting section and the insulating layer projecting section respectively, which project from an end portion of the metal supporting substrate. Here, FIG. 7A is a schematic cross-sectional view showing the periphery of the connecting terminal area in the present invention similarly to the above-mentioned FIG. 2B, FIG. 7B is a schematic plan view observing FIG. 7A from the wiring layer 3 side, and FIG. 7C is a schematic plan view observing FIG. 7A from the metal supporting substrate 1 side. In the present invention, as shown in FIG. 7A, a length $L_3$ by which the wiring layer projecting section 3A projects from an end portion 1a of the metal supporting substrate 1 is preferably within 25 to 80 μm, for example. As shown in FIG. 7B, a width $W_3$ of the wiring layer projecting section 3A is preferably within 25 to 80 μm, for example.

Also, in the present invention, as shown in FIG. 7C, it is preferable that the insulating layer 2 has the insulating layer projecting section 2A and an insulating layer supporting section 2B for supporting the base of the insulating layer projecting section 2A, and an end portion 2b of the insulating layer supporting section 2B projects from an end portion 1a of the metal supporting substrate 1. The reason therefor is that such a structure may prevent the wiring layer projecting section 3A and the metal supporting substrate 1 from contacting to short-circuit during bending, for example. In addition, the transformation of the wiring layer projecting section 3A may be also prevented. In the case where an end portion 2b of the insulating layer supporting section 2B does not project from an end portion 1a of the metal supporting substrate 1, there are a possibility that the wiring layer projecting section 3A and the metal supporting substrate 1 contact to short-circuit during bending, and a possibility of short-circuiting during solder joining after bending. Thus, from the viewpoint of easily performing bending, the metal supporting substrate 1 in a tip portion (a projecting section) is preferably removed to allow a flying structure. Here, in the case where a length by which the insulating layer projecting section 2A projects from an end portion 1a of the metal supporting substrate 1 is regarded as $L_2$, $L_2$ may be represented by the sum of a length $L_{21}$ of the insulating layer projecting section 2A and a length $L_{22}$ of the insulating layer supporting section 2B. For example, $L_{22}/L_2$ is preferably 50% or more, and more preferably within 50 to 80%. For example, $L_{22}$ is preferably 40 μm or more, and more preferably within 40 to 80 μm. On the other hand, for example, $L_{21}$ is preferably within 20 to 60 μm, and more preferably within 20 to 40 μm. In FIG. 7C, the case where the insulating layer 2 has the insulating layer supporting section 2B is exemplified, and the insulating layer 2 in the present invention may not have the insulating layer supporting section 2B.

Figure 8A:
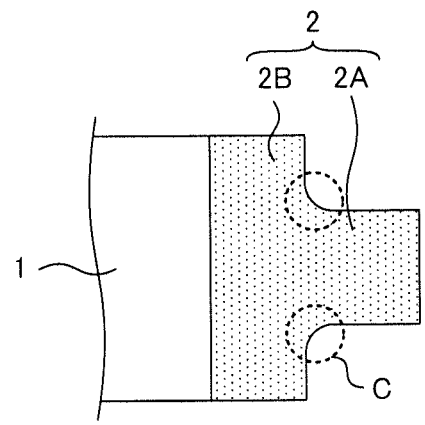
FIGS. 8A and 8B are each a schematic plan view explaining a suspension substrate of the present invention.
Figure 8B:
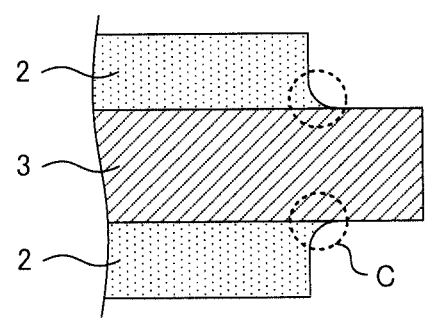

FIG. 8A is a schematic plan view observing the connecting terminal area from the metal supporting substrate 1 side similarly to FIG. 7C, and FIG. 8B is a schematic plan view observing the connecting terminal area from the wiring layer 3 side. In the present invention, as shown in FIGS. 8A and 8B, it is preferable that the insulating layer 2 has the insulating layer projecting section 2A and the insulating layer supporting section 2B for supporting the base of the insulating layer projecting section 2A, and an intersection point of the insulating layer projecting section 2A and the insulating layer supporting section 2B is a curve shape C. The reason therefor is that the strength of a connecting terminal may be further improved by making the base of the insulating layer projecting section 2A with transformation easily caused into the curve shape. In addition, this curve shape C is preferably an arc shape and a radius thereof is preferably within 3 to 30 μm, for example.

B. Manufacturing Method of Suspension Substrate

Next, a manufacturing method of a suspension substrate of the present invention is described. The manufacturing method of a suspension substrate of the present invention comprises the steps of: preparing a laminated body and etching an insulating member, wherein in the laminated body preparing step, the laminated body comprises a metal supporting substrate, an insulating member formed on the above-mentioned metal supporting substrate, and a wiring layer formed on the above-mentioned insulating member; in a position for forming a connecting terminal area for connecting with a device, the above-mentioned wiring layer has a wiring layer projecting section projecting from an end portion of the above-mentioned metal supporting substrate and composing a connecting terminal; the above-mentioned wiring layer projecting section is provided by a plurality; an adjusting section formed on the above-mentioned insulating member and composed of a first adjusting section and a second adjusting section is provided on both sides of the above-mentioned plural wiring layer projecting sections; and in a case when the outermost wiring layer projecting sections of the above-mentioned plural wiring layer projecting sections are regarded as a first outermost wiring layer projecting section and a second outermost wiring layer projecting section respectively, a gap between the above-mentioned first outermost wiring layer projecting section and the above-mentioned first adjusting section, a gap between the above-mentioned adjacent wiring layer projecting sections, and a gap between the above-mentioned second outermost wiring layer projecting section and the above-mentioned second adjusting section are equal; and wherein in the insulating member etching step, the above-mentioned insulating member is wet-etched while using the above-mentioned wiring layer projecting section and the above-mentioned adjusting section as a resist to form an insulating layer having an insulating layer projecting section projecting from the end portion of the above-mentioned metal supporting substrate and supporting the above-mentioned wiring layer projecting section.

FIGS. 9A to 9L are schematic cross-sectional views explaining an example of the manufacturing method of the suspension substrate of the present invention. Here, FIGS. 9A, 9C, 9E, 9G, 9I and 9K correspond to an A-A cross-sectional view of FIG. 2A similarly to FIG. 2B. On the other hand, FIGS. 9B, 9D, 9F, 9H, 9J and 9L correspond to a B-B cross-sectional view of FIG. 2A similarly to FIG. 2C.

Figure 9A:
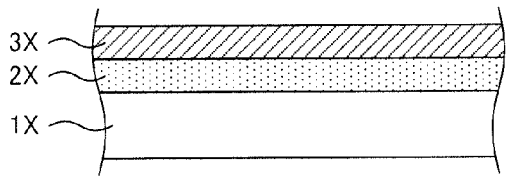
FIGS. 9A to 9L are schematic cross-sectional views explaining an example of a manufacturing method of a suspension substrate of the present invention.
Figure 9B:
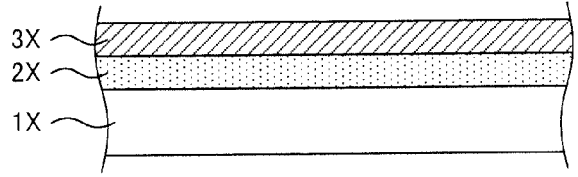
Figure 9C:
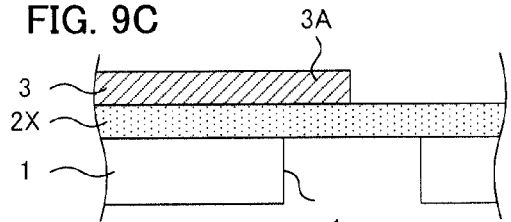
Figure 9D:
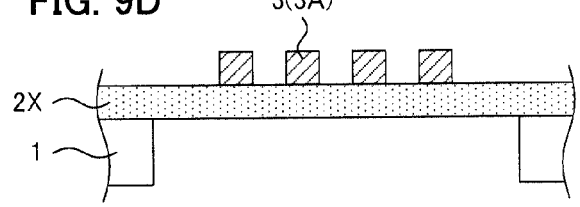
Figure 9E:
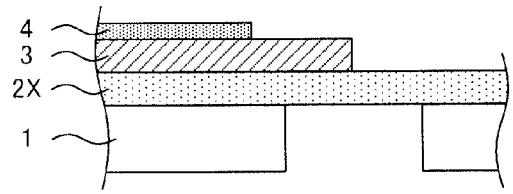
Figure 9F:
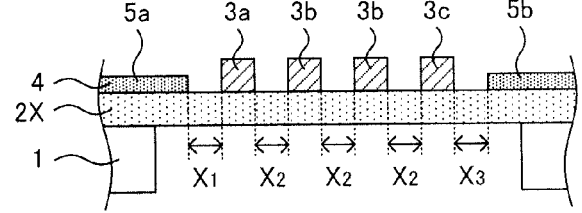

In the manufacturing method of a suspension substrate in FIGS. 9A to 9L, a laminate member having a metal supporting member 1X, an insulating member 2X formed on the metal supporting member 1X, and a wiring member 3X formed on the insulating member 2X is first prepared in a position for forming a connecting terminal area (FIGS. 9A and 9B). Next, a resist pattern is produced on the metal supporting member 1X and the wiring member 3X by using DFR (dry film resist) to form a metal supporting substrate 1 and a wiring layer 3 by wet-etching the metal supporting member 1X and the wiring member 3X exposed from the resist pattern (FIGS. 9C and 9D). This wiring layer 3 has a wiring layer projecting section 3A projecting from an end portion 1a of the metal supporting substrate 1 and composing a connecting terminal. Next, a cover layer 4 is formed on the wiring layer 3 so that at least a part of the wiring layer projecting section 3A is exposed (FIG. 9E). Simultaneously, as shown in FIG. 9F, a part of the cover layer 4 is formed as an adjusting section 5. Thus, a laminated body in the present invention is obtained. In this laminated body, a gap $X_1$ between the first outermost wiring layer projecting section 3a and the first adjusting section 5a, a gap $X_2$ between the adjacent wiring layer projecting sections 3b, and a gap $X_3$ between the second outermost wiring layer projecting section 3c and the second adjusting section 5b are equal.

Figure 9G:
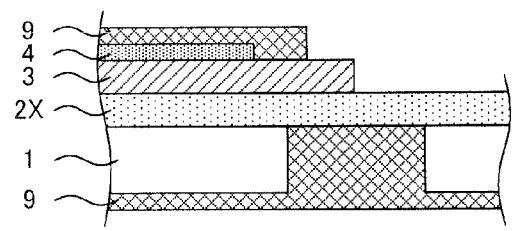
Figure 9H:
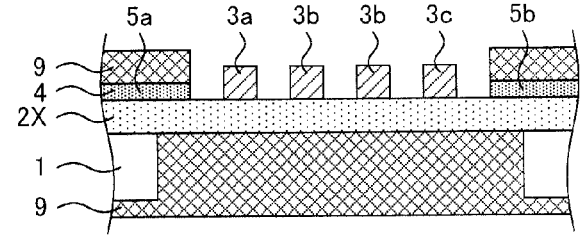
Figure 9I:
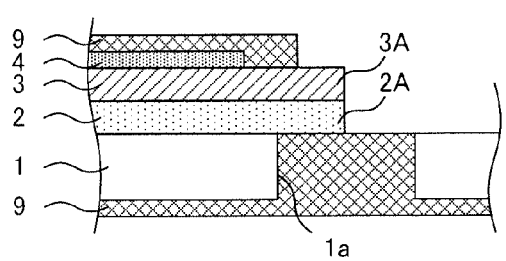
Figure 9J:
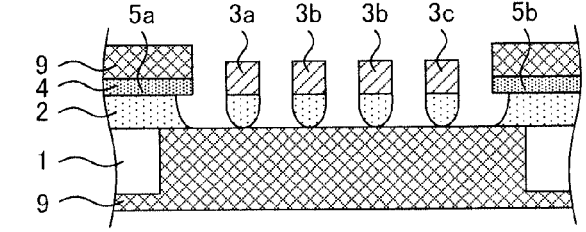
Figure 9K:
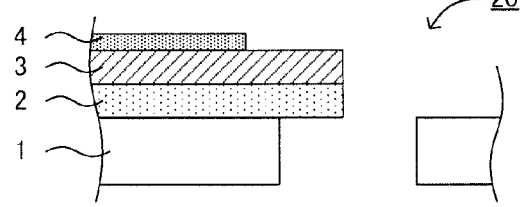
Figure 9L:
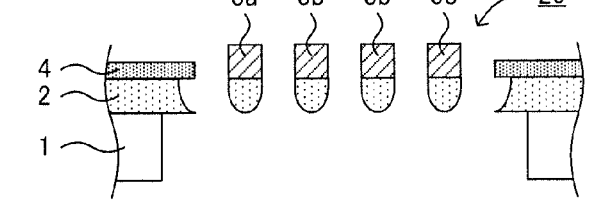

Thereafter, a resist pattern 9 is formed so as to close an opening of the metal supporting substrate 1 by using DFR (FIGS. 9G and 9H). In this method, a part of the cover layer 4 is used as the adjusting section 5, so that a material having a sufficient lower etching rate than an insulating layer 2 is ordinarily used for the cover layer 4. Thus, the necessity of protecting the cover layer 4 (the adjusting section 5) itself is low. However, in the case of completely preventing surface deterioration of the cover layer 4 (the adjusting section 5) and forming an insulating layer supporting section 2B shown in the above-mentioned FIG. 7C, the resist pattern 9 is preferably formed on the surface of the cover layer 4 by using DFR. Next, the insulating member 2X is wet-etched while using the wiring layer projecting sections 3a to 3c and the adjusting sections 5a and 5b as a resist to form an insulating layer 2 having an insulating layer projecting section 2A projecting from an end portion 1a of the metal supporting substrate 1 and supporting the wiring layer projecting section 3A (FIGS. 9I and 9J). Lastly, a suspension substrate 20 is obtained by removing the resist pattern 9 (FIGS. 9K and 9L).

According to the present invention, a laminated body, in which the gap between the first outermost wiring layer projecting section and the first adjusting section, the gap between the adjacent wiring layer projecting sections, and the gap between the second outermost wiring layer projecting section and the second adjusting section are equal, is used, so that the reagent circumference amount of an etching reagent in forming the insulating layer may be uniformized to obtain a suspension substrate such that the thickness of the insulating layer projecting section for supporting the wiring layer projecting section is uniform.

Figure 10A:
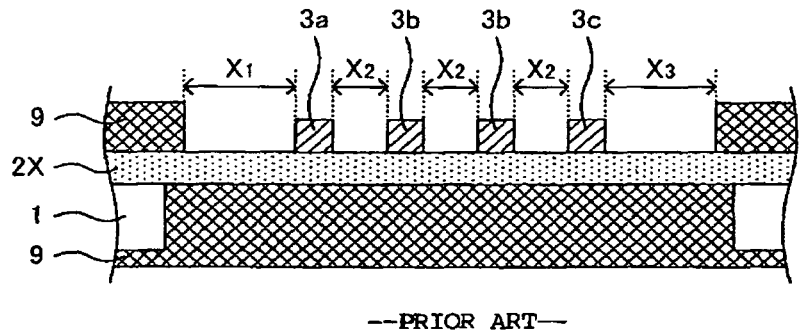
FIGS. 10A and 10B are schematic cross-sectional views explaining a manufacturing method of a conventional suspension substrate.
Figure 10B:
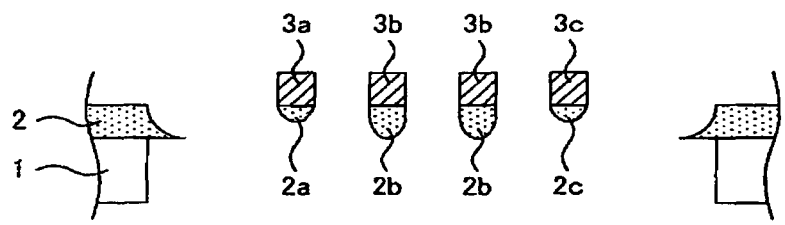

Next, the effect of the manufacturing method of a suspension substrate of the present invention is described by using FIGS. 10 and 11. Here, as shown in FIG. 10A, conventionally, a gap $X_1$ between the first outermost wiring layer projecting section 3a and the resist pattern 9 and a gap $X_3$ between the second outermost wiring layer projecting section 3c and the resist pattern 9 were generally larger than a gap $X_2$ between the adjacent wiring layer projecting sections 3b. In this case, the reagent circumference amount of an etching reagent in the gap $X_1$ and the gap $X_3$ becomes larger than the reagent circumference amount of an etching reagent in the gap $X_2$. As a result, as shown in FIG. 10B, an insulating layer projecting section 2a and an insulating layer projecting section 2c are excessively etched and the thickness of these becomes smaller than the thickness of an insulating layer projecting section 2b. Thus, the problem is that the insulating layer projecting section 2a and the insulating layer projecting section 2c are not sufficiently reinforced so that the transformation of the wiring layer projecting section is caused.

Figure 11A:
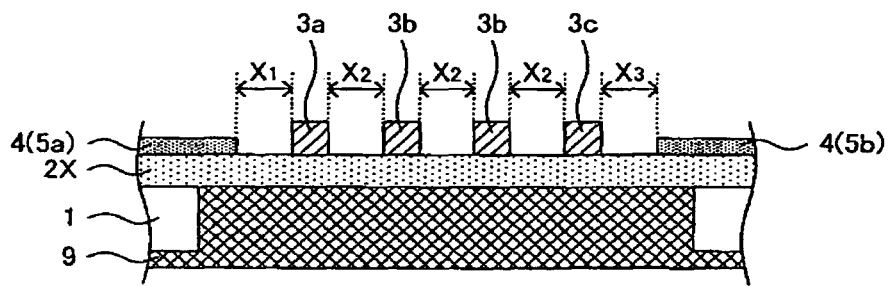
FIGS. 11A and 11B are schematic cross-sectional views explaining a manufacturing method of a suspension substrate of the present invention.
Figure 11B:
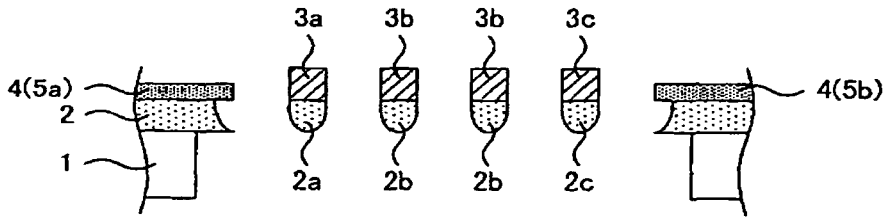

On the contrary, in the present invention, as shown in FIG. 11A, the gap $X_1$ between the first outermost wiring layer projecting section 3a and the adjusting section 5, the gap $X_2$ between the adjacent wiring layer projecting sections 3b, and the gap $X_3$ between the second outermost wiring layer projecting section 3c and the adjusting section 5 are equal. Thus, the reagent circumference amount of an etching reagent in the gap $X_1$, the gap $X_2$ and the gap $X_3$ becomes equal. As a result, as shown in FIG. 11B, the insulating layer projecting sections 2a to 2c with high uniformity of thickness are obtained.

In FIG. 11A, a part of the cover layer 4 is used as the adjusting section 5. In noting only the point that the reagent circumference amount of an etching reagent is equalized, equal gaps $X_1$ to $X_3$ brings so desired an effect that a resist pattern using conventional DFR as the adjusting section 5 may be also used. Above all, in the present invention, a material for the adjusting section 5 is preferably a material high in adhesion properties to the insulating member 2X. The reason therefor is that an etching reagent for the insulating layer may be prevented from permeating to allow processing with high accuracy.

The manufacturing method of a suspension substrate of the present invention is hereinafter described in each step.

1. Laminated Body Preparing Step

The laminated body preparing step in the present invention is step of preparing the above-mentioned laminated body (FIGS. 9A to 9F).

Figure 12A:
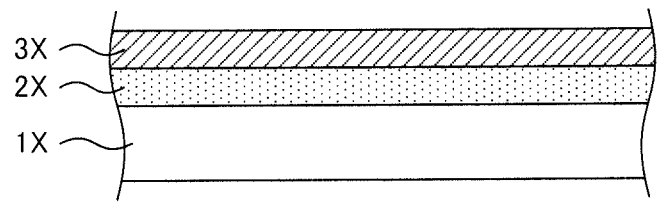
FIGS. 12A and 12B are schematic cross-sectional views explaining a manufacturing method of a suspension substrate of the present invention.
Figure 12B:
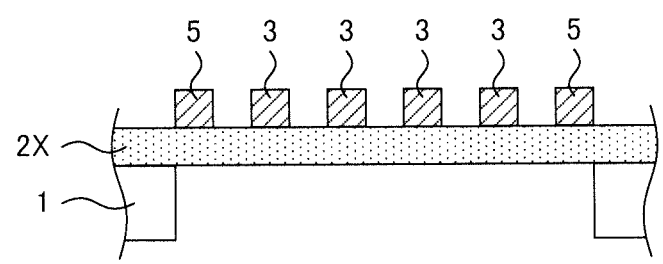

A forming method of the laminated body is not particularly limited if it is a method to obtain a desired laminated body. Examples of the forming method of the laminated body include a method using a laminate member, as shown in FIGS. 9A to 9F. FIGS. 9A to 9L show an example such that a part of the cover layer 4 is used as the adjusting sections 5a and 5b, and as shown in the above-mentioned FIGS. 5A and 5B, in the present invention, the wiring layer or a dummy wiring layer in a routing area may be used as the adjusting section 5. In this case, as shown in FIGS. 12A and 12B, the adjusting section 5 may be formed simultaneously with the wiring layer 3 in etching the wiring member 3X.

In the case of using a laminate member having a metal supporting member, an insulating member and a wiring member, a metal supporting substrate and a wiring layer are formed by etching the metal supporting member and the wiring member, respectively. A method of etching the metal supporting member and the wiring member is not particularly limited and specific examples thereof include wet etching. Kinds of an etching reagent used for wet etching are preferably selected properly in accordance with kinds of the metal supporting member and the wiring member; for example, in the case when a material for the metal supporting member is SUS and a material for the wiring member is copper, an iron chloride-based etching reagent may be used. Also, in the present invention, a resist pattern is ordinarily formed by using DFR to etch the metal supporting member and the wiring member exposed from the resist pattern.

Also, in the present invention, the metal supporting substrate is preferably etched so that an insulating layer supporting section for supporting the base of the insulating layer projecting section is shaped so as to project from an end portion of the metal supporting substrate in etching the metal supporting substrate. The reason therefor is that such a structure may prevent the wiring layer projecting section and the metal supporting substrate from contacting to short-circuit during bending, for example.

The laminated body in the present invention may further have the cover layer for covering the wiring layer. A forming method of the cover layer is preferably selected properly in accordance with kinds of a material for the cover layer. For example, in the case when the material for the cover layer is a photosensitive material, the cover layer having a predetermined pattern may be formed by exposure and development. On the other hand, in the case when the material for the cover layer is a non-photosensitive material, the cover layer having a predetermined pattern may be formed by etching through a resist pattern.

Each member used for the laminated body is the same as the contents described in the above-mentioned "A. Suspension substrate". Also, in the present invention, the laminated body may be formed by an additive method.

2. Insulating Member Etching Step

Next, the insulating member etching step in the present invention is described. The insulating member etching step in the present invention is step of wet-etching the above-mentioned insulating member while using the above-mentioned wiring layer projecting section and the above-mentioned adjusting section as a resist to form an insulating layer having an insulating layer projecting section projecting from an end portion of the above-mentioned metal supporting substrate and supporting the above-mentioned wiring layer projecting section (FIGS. 9G to 9L).

Kinds of an etching reagent used for wet-etching the insulating member are preferably selected properly in accordance with kinds of the insulating layer; for example, in the case when a material for the insulating member is a polyimide resin, an alkali-based etching reagent may be used.

The present invention has a characteristic such that the wiring layer projecting section is used as a resist. Adhesion properties between the wiring layer and the insulating member are so higher than adhesion properties between a resist pattern by using DFR and the insulating layer that an etching reagent may be prevented from permeating to allow the insulating member to be processed with high accuracy. Also, the wiring layer is ordinarily useful as a resist of the insulating member by reason of not being etched in an etching reagent for the insulating member. In addition, the present invention has a characteristic such that the adjusting section is used as a resist. The use of a material high in adhesion properties to the insulating member as a material for the adjusting section, similarly to the above, allows an etching reagent to be prevented from permeating and allows the insulating member to be processed with high accuracy.

Figure 13A:
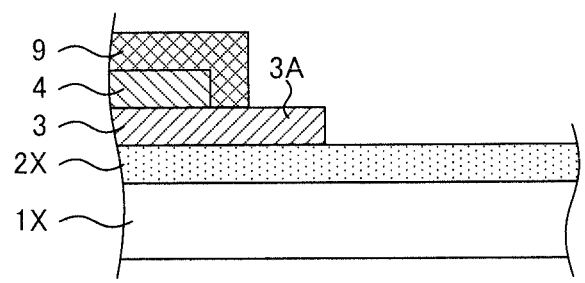
FIGS. 13A and 13B are schematic views explaining a manufacturing method of a suspension substrate of the present invention.
Figure 13B:
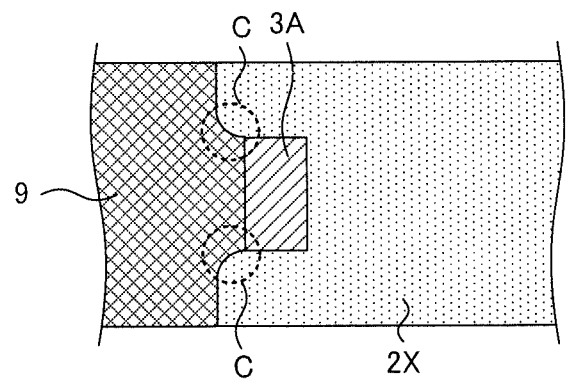

Also, in the present invention, in the insulating member etching step, a resist pattern is preferably formed to wet-etch the insulating member so that a curve shape is formed at an intersection point of the insulating layer projecting section and the insulating layer supporting section for supporting the base of the insulating layer projecting section. The reason therefor is that the strength of a connecting terminal may be further improved by making the base of the insulating layer projecting section, which causes transformation easily, into the curve shape. Specifically, as shown in FIGS. 13A and 13B, the curve shape C is preferably provided in the resist pattern 9 formed on the wiring layer 3. This curve shape C may be obtained by performing predetermined exposure and development in forming the resist pattern 9.

3. Other Steps

The present invention preferably has plating portion forming step of forming a plating portion on the surface of the wiring layer exposed in a connecting terminal area, other than the above-mentioned steps. Examples of a method of forming a plating portion include an electroplating method. The suspension substrate obtained by the present invention is the same as the contents described in the above-mentioned "A. Suspension substrate"; therefore, the description herein is omitted.

C. Suspension

Next, a suspension of the present invention is described. The suspension of the present invention comprises the above-mentioned suspension substrate.

According to the present invention, the use of the above-mentioned suspension substrate allows a suspension excellent in connection stability.

Figure 14:
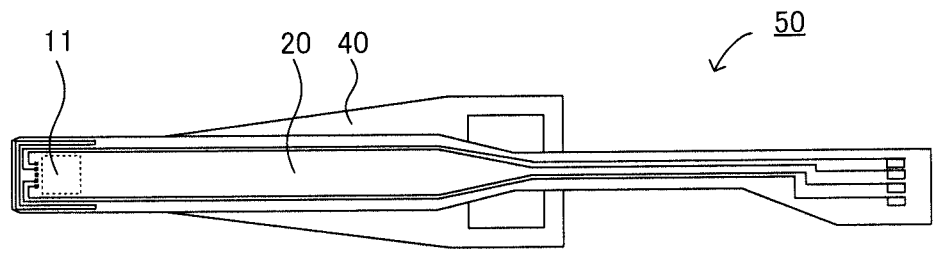
FIG. 14 is a schematic plan view showing an example of a suspension of the present invention.

FIG. 14 is a schematic plan view showing an example of the suspension of the present invention. A suspension 50 shown in FIG. 14 has the above-mentioned suspension substrate 20 and a load beam 40 provided on the surface of the suspension substrate 20 on the opposite side to the surface on which the device mounting area 11 is formed.

The suspension of the present invention has at least the suspension substrate and ordinarily has the load beam additionally. The suspension substrate is the same as the contents described in the above-mentioned "A. Suspension substrate"; therefore, the description herein is omitted. The same load beam as is used for a general suspension may be used for the load beam.

D. Device-mounted Suspension

Next, a device-mounted suspension of the present invention is described. The device-mounted suspension of the present invention comprises the above-mentioned suspension and a device mounted on the device mounting area of the above-mentioned suspension.

According to the present invention, the use of the above-mentioned suspension allows a device-mounted suspension excellent in connection stability.

Figure 15:
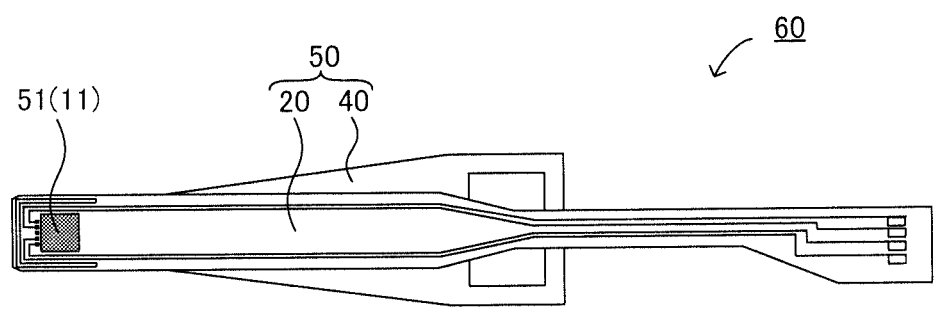
FIG. 15 is a schematic plan view showing an example of a device-mounted suspension of the present invention.

FIG. 15 is a schematic plan view showing an example of the device-mounted suspension of the present invention. A device-mounted suspension 60 shown in FIG. 15 has the above-mentioned suspension 50 and a device 51 mounted on the device mounting area 11 of the suspension 50.

The device-mounted suspension of the present invention has at least the suspension and the device. The suspension is the same as the contents described in the above-mentioned "C. Suspension"; therefore, the description herein is omitted.

E. Hard Disk Drive

Next, a hard disk drive of the present invention is described. The hard disk drive of the present invention includes the above-mentioned device-mounted suspension.

According to the present invention, the use of the above-mentioned device-mounted suspension allows a further highly functionalized hard disk drive.

Figure 16:
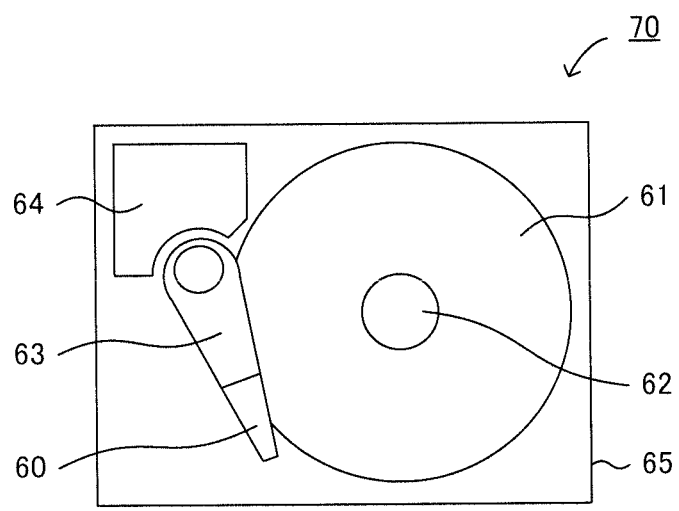
FIG. 16 is a schematic plan view showing an example of a hard disk drive of the present invention.

FIG. 16 is a schematic plan view showing an example of the hard disk drive of the present invention. A hard disk drive 70 shown in FIG. 16 has the above-mentioned device-mounted suspension 60, a disk 61 for which the device-mounted suspension 60 performs writing and reading of data, a spindle motor 62 for rotating the disk 61, an arm 63 and a voice coil motor 64 for moving the device of the device-mounted suspension 60, and a case 65 for sealing the above-mentioned members.

The hard disk drive of the present invention has at least the device-mounted suspension, and ordinarily has the disk, the spindle motor, the arm and the voice coil motor additionally. The device-mounted suspension is the same as the contents described in the above-mentioned "D. Device-mounted suspension"; therefore, the description herein is omitted. The same members as are used for a general hard disk drive may be used for other members.

The present invention is not limited to the above-mentioned embodiments. The above-mentioned embodiments are exemplification, and any is included in the technical scope of the present invention if it has substantially the same constitution as the technical idea described in the claim of the present invention and offers similar operation and effect thereto.

EXAMPLES

The present invention is hereinafter described more specifically while using examples.

Example 1

In Example 1, as shown in FIG. 2C, a suspension substrate was manufactured by using a part of a cover layer 4 as a first adjusting section 5a and a second adjusting section 5b. The same method as the method shown in FIGS. 9A to 9L was adopted for manufacturing the suspension substrate. First, a laminate member having a metal supporting member 1X made of stainless steel (SST) with a thickness of 20 μm, an insulating member 2X made of a polyimide resin with a thickness of 10 μm, and a wiring member 3X made of plated copper with a thickness of 9 μm was prepared (FIGS. 9A and 9B). Next, both faces of the laminate member were covered with an acrylic photosensitive dry film and subjected to exposure and development to thereby form a predetermined resist pattern, and thereafter the metal supporting member 1X and the wiring member 3X exposed from the resist pattern were wet-etched by using an iron chloride-based etching reagent to thereby form a metal supporting substrate 1 and a wiring layer 3 (FIGS. 9C and 9D). Next, the cover layer 4, the first adjusting section 5a and the second adjusting section 5b were formed by using a non-photosensitive polyimide resin described in Japanese Patent Application Laid-Open No. 2008-310946 (FIGS. 9E and 9F). In this case, $X_1$, $X_2$ and $X_3$ in FIG. 9F were determined at 40 μm.

Thereafter, an acrylic photosensitive dry film (a thickness of 38 μm) was disposed on both faces of the obtained laminated body, irradiated with ultraviolet rays at an irradiation amount of 150 mJ/cm$^2$ from a high-pressure mercury-vapor lamp by using a photomask, and further subjected to spray development by using an $Na_2CO_3$ aqueous solution with a concentration of 1 wt % to thereby form a predetermined resist pattern (FIGS. 9G and 9H). Next, with the use of an organic alkaline etching reagent, the insulating member 2X was etched on the conditions of 80° C. and 3 minutes while making the etching reagent overflow the upper side face of an etching bath (FIGS. 9I and 9J). Lastly, a sodium hydroxide aqueous solution with a concentration of 1 wt % heated to 50° C. was sprayed thereon at a spray pressure of 1 kg/cm$^2$ to peel off the resist pattern. Thus, the suspension substrate was obtained (FIGS. 9K and 9L).

Next, in the obtained suspension substrate, the thickness of an insulating layer projecting section for supporting a wiring layer projecting section was measured by a confocal laser microscope. As a result, the thickness of the insulating layer projecting section for supporting internal wiring layer projecting sections became somewhat larger than the thickness of the insulating layer projecting section for supporting outermost wiring layer projecting sections. In samples of n=40, the difference between both (the difference A in thickness) was 0.4 μm at the minimum and 0.7 μm at the maximum. Similarly, in samples of n=4000, when a ratio of the occurrence of wrinkling (transformation) in the outermost wiring layer projecting sections was measured by a stereoscopic microscope, the transformation incidence rate was 0.05%.

Example 2

In Example 2, as shown in FIG. 5A, a suspension substrate was manufactured by using a part of the wiring layer 3 in a routing area as an adjusting section 5. Specifically, the suspension substrate was obtained in the same manner as Example 1 except for changing the shape of the cover layer and the shape of the wiring layer in a routing area to use a part of the wiring layer in a routing area as the adjusting section.

In the obtained suspension substrate, the thickness of an insulating layer projecting section for supporting a wiring layer projecting section was measured by a confocal laser microscope. As a result, the thickness of the insulating layer projecting section for supporting internal wiring layer projecting sections became somewhat larger than the thickness of the insulating layer projecting section for supporting outermost wiring layer projecting sections. In samples of n=40, the difference between both (the difference A in thickness) was 0.2 μm at the minimum and 0.3 μm at the maximum. Similarly, in samples of n=4000, when a ratio of the occurrence of wrinkling (transformation) in the outermost wiring layer projecting sections was measured by a stereoscopic microscope, the transformation incidence rate was 0.03%.

The reason why the transformation incidence rate in Example 2 became smaller than the transformation incidence rate in Example 1 is conceived to be that the use of copper as the adjusting section may improve adhesion properties to the insulating member 2X as compared with the case of using a polyimide resin to further restrain the etching reagent from permeating.

Comparative Example 1

The suspension substrate was obtained in the same manner as Example 1 except for determining $X_1$ and $X_3$ at 55 μm and $X_2$ at 40 μm. In the obtained suspension substrate, the thickness of an insulating layer projecting section for supporting a wiring layer projecting section was measured by a confocal laser microscope. As a result, the thickness of the insulating layer projecting section for supporting internal wiring layer projecting sections became larger than the thickness of the insulating layer projecting section for supporting outermost wiring layer projecting sections. In samples of n=40, the difference between both (the difference A in thickness) was 2 μm at the minimum and 6 μm at the maximum. Similarly, in samples of n=4000, when a ratio of the occurrence of wrinkling (transformation) in the outermost wiring layer projecting sections was measured by a stereoscopic microscope, the transformation incidence rate was 0.13%.

As is found in comparison between Comparative Example 1 and Example 1, in the present invention, the equalization of $X_1$, $X_2$ and $X_3$ may uniformize the thickness of the insulating layer for supporting a connecting terminal having a flying structure.

Examples 3 to 6 and Comparative Examples 2 to 4

The suspension substrate was obtained respectively in the same manner as Example 1 except for modifying $X_1$, $X_2$ and $X_3$ into values shown in the after-mentioned Table 1. The difference A in thickness and the transformation incidence rate were measured in the same manner as Example 1 with respect to the obtained suspension substrate. The results are shown in Table 1.

TABLE 1

| | $X_1, X_3$ (μm) | $X_2$ (μm) | $X_1, X_3/X_2$ | Adjusting Section | Difference A in Thickness | Transformation Incidence Rate (%) |
|---|---|---|---|---|---|---|
| Example 1 | 40 | 40 | 1.0 | cover layer | 0.4 μm-0.7 μm | 0.05 |
| Example 2 | 40 | 40 | 1.0 | wiring layer | 0.2 μm-0.3 μm | 0.03 |
| Example 3 | 55 | 45 | 1.2 | cover layer | 0.3 μm-0.6 μm | 0.08 |
| Example 4 | 60 | 50 | 1.2 | cover layer | 0.3 μm-0.6 μm | 0.05 |
| Example 5 | 65 | 60 | 1.1 | cover layer | 0.3 μm-0.6 μm | 0.03 |
| Example 6 | 30 | 40 | 0.8 | cover layer | 0.3 μm-0.7 μm | 0.03 |
| Comparative Example 1 | 55 | 40 | 1.4 | cover layer | 0.2 μm-0.6 μm | 0.13 |
| Comparative Example 2 | 65 | 45 | 1.4 | cover layer | 0.6 μm-1.0 μm | 0.38 |
| Comparative Example 3 | 80 | 50 | 1.6 | cover layer | 0.8 μm-2.0 μm | 2.00 |
| Comparative Example 4 | 90 | 60 | 1.5 | cover layer | 0.8 μm-1.2 μm | 1.50 |

As shown in Table 1, it was confirmed that the transformation incidence rate decreased vastly when $X_1$ and $X_3$ were within 0.8 to 1.2 times the value of $X_2$. On the contrary, when $X_1$ and $X_3$ were not within 0.8 to 1.2 times the value of $X_2$, the transformation incidence rate increased.

Reference Signs List

1 . . . metal supporting substrate, 1X . . . metal supporting member, 2 . . . insulating layer, 2A . . . insulating layer projecting section, 2X . . . insulating member, 3 . . . wiring layer, 3A . . . wiring layer projecting section, 3X . . . wiring member, 4 . . . cover layer, 5 . . . adjusting section, 5a . . . first adjusting section, 5b . . . second adjusting section, 11 . . . device mounting area, 12 . . . external circuit board connecting area, 13 . . . wiring layer, 20 . . . suspension substrate, 23 . . . connecting terminal of device, 24 . . . device, 25 . . . solder ball, X . . . connecting terminal area

The invention claimed is:

1. A suspension substrate, comprising a metal supporting substrate, an insulating layer formed on the metal supporting substrate, and a wiring layer formed on the insulating layer;
wherein in a connecting terminal area for connecting with a device, the wiring layer has a wiring layer projecting section projecting from an end portion of the metal supporting substrate and composing a connecting terminal;
in the connecting terminal area, the insulating layer has an insulating layer projecting section projecting from the end portion of the metal supporting substrate and supporting the wiring layer projecting section;
the wiring layer projecting section is provided by a plurality;
an adjusting section formed on the insulating layer and composed of a first adjusting section and a second adjusting section is provided on both sides of the plural wiring layer projecting sections; and
in a case when outermost wiring layer projecting sections of the plural wiring layer projecting sections are regarded as a first outermost wiring layer projecting section and a second outermost wiring layer projecting section respectively, a gap between the first outermost wiring layer projecting section and the first adjusting section, a gap between the adjacent wiring layer projecting sections, and a gap between the second outermost wiring layer projecting section and the second adjusting section are equal.

2. The suspension substrate according to claim 1, wherein the adjusting section is a part of a cover layer for covering the wiring layer.

3. The suspension substrate according to claim 1, wherein the adjusting section is a part of the wiring layer in a routing area.

4. The suspension substrate according to claim 1, wherein the adjusting section is a dummy wiring section not connected electrically with the wiring layer.

5. The suspension substrate according to claim 1, wherein a thickness of the insulating layer projecting section for supporting the first outermost wiring layer projecting section and a thickness of the insulating layer projecting section for supporting the second outermost wiring layer projecting section are 50% or more of the insulating layer projecting section for supporting an internal wiring layer projecting section inside the plural wiring layer projecting sections.

6. The suspension substrate according to claim 1, wherein the gap between the first outermost wiring layer projecting section and the first adjusting section, the gap between the adjacent wiring layer projecting sections, and the gap between the second outermost wiring layer projecting section and the second adjusting section are each within 30 to 70μm.

* * * * *